(12) United States Patent
Steiner et al.

(10) Patent No.: US 11,734,107 B2
(45) Date of Patent: Aug. 22, 2023

(54) DECODING SCHEME FOR ERROR CORRECTION CODE STRUCTURE

(71) Applicant: Kioxia Corporation, Tokyo (JP)

(72) Inventors: Avi Steiner, Kiriat Motzkin (IL); Hanan Weingarten, Herzliya (IL); Meir Nadam-Olegnowicz, Binyamina (IL); Ofir Kanter, Haifa (IL); Amir Nassie, Haifa (IL)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/355,555

(22) Filed: Mar. 15, 2019

(65) Prior Publication Data

US 2020/0293399 A1 Sep. 17, 2020

(51) Int. Cl.
*G06F 11/10* (2006.01)
*G11C 29/00* (2006.01)
*G06F 11/00* (2006.01)

(52) U.S. Cl.
CPC ........ *G06F 11/1068* (2013.01); *G06F 11/004* (2013.01); *G06F 11/1028* (2013.01); *G11C 29/781* (2013.01); *G11C 29/844* (2013.01)

(58) Field of Classification Search
None
See application file for complete search history.

(56) References Cited

U.S. PATENT DOCUMENTS

| | | | | |
|---|---|---|---|---|
| 5,640,286 A | * | 6/1997 | Acosta | G11B 20/10 360/48 |
| 6,052,812 A | * | 4/2000 | Chen | H03M 13/15 714/748 |
| 6,615,387 B1 | * | 9/2003 | Williamson | H03M 13/091 714/758 |
| 7,296,212 B1 | * | 11/2007 | Hammons, Jr. | H03M 13/2909 714/701 |
| 8,335,977 B2 | | 12/2012 | Weingarten et al. | |
| 8,341,502 B2 | | 12/2012 | Steiner et al. | |
| 8,359,518 B2 | * | 1/2013 | Rumbolt | H03M 13/2909 714/755 |

(Continued)

FOREIGN PATENT DOCUMENTS

JP 2001-144628 A 5/2001

OTHER PUBLICATIONS

Laubach, et al., More on Folded BCH FEC, IEEE P802.3ca NGEPON Interim Meeting, 2017, pp. 1-21.

(Continued)

*Primary Examiner* — Steve N Nguyen
(74) *Attorney, Agent, or Firm* — Foley & Lardner LLP

(57) ABSTRACT

Various implementations described herein relate to systems and methods for performing error correction in a flash memory device by determining suggested corrections by decoding a codeword. In addition, whether a first set of the suggested corrections obtained based on a first component code of the plurality of component codes agree with a second set of the suggested corrections obtained based on a second component code of the plurality of component codes is determined. One of accepting the first set of the suggested corrections or rejecting the first set of the suggested corrections is selected based on whether the first set of the suggested corrections and the second set of the suggested corrections agree.

20 Claims, 8 Drawing Sheets

(56) References Cited

U.S. PATENT DOCUMENTS

| | | | |
|---|---|---|---|
| 8,411,677 B1* | 4/2013 | Colloff | H04L 69/12 |
| | | | 370/389 |
| 8,468,431 B2 | 6/2013 | Steiner et al. | |
| 8,510,639 B2 | 8/2013 | Steiner et al. | |
| 8,621,321 B2 | 12/2013 | Steiner et al. | |
| 8,627,188 B2 | 1/2014 | Weingarten et al. | |
| 8,700,970 B2 | 4/2014 | Steiner et al. | |
| 8,850,296 B2 | 9/2014 | Weingarten et al. | |
| 8,850,297 B1 | 9/2014 | Steiner et al. | |
| 8,959,418 B1* | 2/2015 | Pfister | H03M 13/2948 |
| | | | 714/746 |
| 9,059,735 B2* | 6/2015 | Li | H03M 13/03 |
| 9,214,964 B1* | 12/2015 | Varnica | H03M 13/2909 |
| 9,231,623 B1* | 1/2016 | Kumar | H03M 13/453 |
| 9,252,816 B1* | 2/2016 | Steiner | H03M 13/2909 |
| 9,397,706 B1* | 7/2016 | Steiner | H03M 13/2918 |
| 9,407,291 B1 | 8/2016 | Weingarten et al. | |
| 9,413,491 B1 | 8/2016 | Sterin | |
| 9,542,262 B1 | 1/2017 | Bar et al. | |
| 9,584,159 B1 | 2/2017 | Weingarten et al. | |
| 10,063,261 B1* | 8/2018 | Croxall, II | H04L 1/0045 |
| 2003/0192005 A1* | 10/2003 | Williamson | H03M 13/1515 |
| | | | 714/758 |
| 2004/0083421 A1* | 4/2004 | Foss | G06F 11/1064 |
| | | | 714/805 |
| 2005/0204254 A1* | 9/2005 | Cucchi | H03M 13/293 |
| | | | 714/753 |
| 2011/0214039 A1* | 9/2011 | Steiner | H03M 13/2927 |
| | | | 714/797 |
| 2012/0239996 A1 | 9/2012 | Higeta et al. | |
| 2014/0059403 A1* | 2/2014 | Sommer | H03M 13/6337 |
| | | | 714/758 |
| 2014/0351672 A1 | 11/2014 | Marrow et al. | |
| 2015/0309875 A1* | 10/2015 | Mittelholzer | G06F 11/1076 |
| | | | 714/766 |
| 2017/0004036 A1* | 1/2017 | Ha | H03M 13/2912 |
| 2017/0179980 A1 | 6/2017 | Lin et al. | |
| 2017/0194989 A1 | 7/2017 | Kumar et al. | |
| 2017/0279468 A1* | 9/2017 | Kumar | H03M 13/2942 |
| 2018/0006667 A1 | 1/2018 | Motwani | |
| 2018/0167088 A1 | 6/2018 | Vakilinia et al. | |

OTHER PUBLICATIONS

PCT/IB2020/052325 ISRWO dated Jul. 7, 2020.
Office Action with a Search Report issued in a Chinese application No. 202080031759.X, dated Jun. 7, 2023.

* cited by examiner

DECODING SCHEME FOR ERROR CORRECTION CODE STRUCTURE

TECHNICAL FIELD

The present disclosure relates generally to systems and methods for decoding schemes for error correction code (ECC) structures for flash memory devices.

BACKGROUND

Flash memory devices (e.g., NAND flash memory devices) enable page reads based on voltage thresholds of the flash memory devices. Due to different noise (e.g., NAND noise) and interference sources during programming and read, errors on information bits stored in flash memory devices can occur. Such errors may be due to one or more of programming errors, read with non-optimal thresholds, retention/read-disturb stresses, and so on. A strong ECC can allow fast programming (with possibly high programming errors) and read under high stress conditions and/or with low-complexity digital signal processing (DSP).

A code rate is defined by a ratio of information content (referred to as a "payload") of a codeword to an overall size of the codeword. For example, for a code that contains k bits and r redundancy bits, the code rate $R_c$ is defined by $$R_c = \frac{k}{k+r}.$$

Conventional encoding methods are not well suited to support codes having high code rates for both hard decoding and soft decoding. For example, conventional low-density parity-check (LDPC) codes that have high code rates (e.g., 0.9) have considerably long code length, resulting in complex and costly implementations.

SUMMARY

In certain aspects, the present implementations are directed to decoding an encoded input payload programmed in a flash memory device using of ECC structure having multiple component codes.

DETAILED DESCRIPTION

Figure 1:
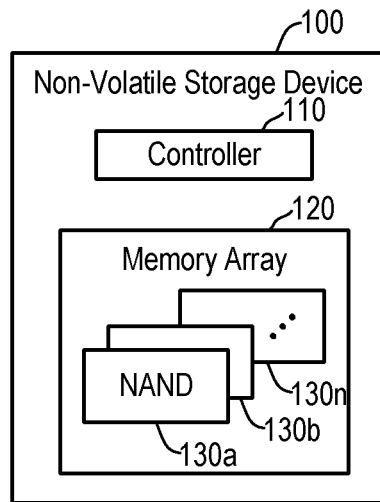
FIG. 1 shows a block diagram of examples of a non-volatile storage device, according to some implementations.

Arrangements disclosed herein relate to systems, apparatuses, methods, and non-transitory computer-readable media for providing flash memory devices (e.g., NAND flash memory devices) with improved endurance and average read performance. The current disclosure relates to an ECC structure that enables correction of high raw bit error rate (RBER) at high performance. In some arrangements, the ECC structure includes a modified half product code, referred to as a half folded-product code (HFPC). As described herein, the ECC structure implementing the HFPC enables high code rates for flash memory devices. In some examples, the ECC encoder/decoder executing the ECC structure described herein can be implemented on a controller hardware and/or firmware. In some examples, the ECC encoder/decoder executing the ECC structure described herein can be implemented on a host software. Low complexity processing can be implemented on the ECC encoder/decoder.

The ECC structure implementing the HFPC and the ECC encoder/decoder executing the ECC structure improve conventional ECC structures and ECC encoders/decoders in various ways. For example, the ECC structure provides high read performance (e.g., high read throughput). In some arrangements, a code construction as described herein is based on simple component codes (such as but not limited to, Bose-Chaudhuri-Hocquenghem (BCH) components) which can be implemented efficiently. The component codes implement iterative decoding. Therefore, the code construction has a more cost-effective implementation as compared to conventional codes (e.g., the LDPC codes) that have complex and costly implementations. This allows the code structure to be suitable for storage applications for flash memory devices (e.g., NAND flash memory devices and controllers thereof).

The simple code components can enable improved encoding/decoding throughput and efficiency with low implementation complexity for both hard input or soft input to the decoder. That is, the ECC structure described herein can provide high error correction capabilities for both hard decoding and soft decoding. For example, the ECC structure can enable high RBER error correction with hard input to the decoder (hard decoding) and can provide high throughput at low implementation complexity. This improves the error correction capabilities of storage systems given that storage systems typically implement a single-read operation. Therefore, high performance on read operations for a storage device can be achieved throughout a lifespan of the storage device. In addition, the ECC structure can enable high RBER error correction with soft input to the decoder (soft decoding), providing high reliability at high program-erase (P/E) cycle counts and in difficult retention conditions, as storage systems typically require a very small uncorrectable bit error rate (UBER) (e.g., 1E-15).

In addition, the ECC structure allows efficient hardware implementation, for instance, by having low power consumption. Furthermore, the ECC structure can be configured to support multiple code rates without compromising reliability, while approximating theoretical bounds for the multiple code rates. Accordingly, the ECC structure can provide a low error floor. The ECC structure enables high endurance and improved resilience to retention and read-disturb stresses.

In some implementations, the code rate of the ECC structure can be configured for each application. For example, a single engine can configure (with firmware) the code parameters to determine the payload size and redundancy size of the ECC in the manner described. This allows using different codes for different type of pages, for example, according to RBER characteristics of the pages. Alternatively, the payload size can be determined in a manner to optimize the tradeoff between performance and reliability.

To assist in illustrating the present implementations, FIG. 1 shows a block diagram of a non-volatile storage device 100 according to some implementations. In some examples, the non-volatile storage device 100 is located in a datacenter (not shown for brevity). The datacenter may include one or more platforms, each of which supports one or more storage devices (such as but not limited to, the non-volatile storage device 100). In some implementations, the storage devices within a platform are connected to a Top of Rack (TOR) switch and can communicate with each other via the TOR switch or another suitable intra-platform communication mechanism. In some implementations, at least one router may facilitate communications among the non-volatile storage devices in different platforms, racks, or cabinets. Examples of the non-volatile storage device 100 include but are not limited to, a solid state drive (SSD), a non-volatile dual in-line memory module (NVDIMM), a Universal Flash Storage (UFS), a Secure Digital (SD) device, and so on.

The non-volatile storage device 100 includes at least a controller 110 and a memory array 120. Other components of the non-volatile storage device 100 are not shown for brevity. As shown, the memory array 120 includes NAND flash memory devices 130a-130n. Each of the NAND flash memory devices 130a-130n includes one or more individual NAND flash dies, which are non-volatile memory (NVM) capable of retaining data without power. Thus, the NAND flash memory devices 130a-130n refer to multiple NAND flash memory devices or dies within the flash memory device 100. Each of the NAND flash memory devices 130a-130n includes a die which has one or more planes. Each plane has multiple blocks, and each block has multiple pages.

While the NAND flash memory devices 130a-130n are shown to be examples of the memory array 120, other examples of non-volatile memory technologies for implementing the memory array 120 include but are not limited to, magnetic random access memory (MRAM), phase change memory (PCM), ferro-electric RAM (FeRAM) or the like. The ECC structure described herein can be likewise implemented on memory systems using such memory technologies.

Examples of the controller 110 include but are not limited to, an SSD controller (e.g., a client SSD controller, a datacenter SSD controller, an enterprise SSD controller, and so on), a UFS controller, or an SD controller, and so on.

The controller 110 can combine raw data storage in the plurality of NAND flash memory devices 130a-130n such that those NAND flash memory devices 130a-130n function as a single storage. The controller 110 can include microcontrollers, buffers, error correction systems, flash translation layer (FTL) and flash interface modules. Such functions can be implemented in hardware, software, and firmware or any combination thereof. In some arrangements, the software/firmware of the controller 110 can be stored in the non-volatile storage 120 or in any other suitable computer readable storage medium.

The controller 110 includes suitable processing and memory capabilities for executing functions described herein, among other functions. As described, the controller 110 manages various features for the NAND flash memory devices 130a-130n including, but not limited to, I/O handling, reading, writing/programming, erasing, monitoring, logging, error handling, garbage collection, wear leveling, logical to physical address mapping, data protection (encryption/decryption), and the like. Thus, the controller 110 provides visibility to the NAND flash memory devices 130a-130n.

The error correction systems of the controller 110 can include or otherwise implement one or more ECC encoders and one or more ECC decoders. The ECC encoders are configured to encode data (e.g., input payload) to be programmed to the non-volatile storage 120 (e.g., to the NAND flash memory devices 130a-130n) using the ECC structures described herein. The ECC decoders are configured to decode the encoded data to correct programming errors, errors caused by reading with non-optimal thresholds, errors caused by retention/read-disturb stresses, and so on.

In some examples, the controller 110 is configured to arrange an input payload in a pseudo triangular matrix form and to perform folded encoding (e.g., folded BCH encoding) for every component code. In some examples, every bit in a payload (e.g., every information bit) can be encoded by (at least) two component codes (also referred to as "code components"), and each component code intersects with all other component codes. That is, for component codes that encode the information bits, the encoding process is performed such that systematic bits of every component code is also encoded by all other component codes. The component codes together provide encoding for every information bit using the component codes.

In some arrangements, the ECC structure uses multi-dimensional encoding. In multi-dimensional encoding, a stream of data is passed through a set of multiple component encoders (implemented or otherwise included by the controller 110) which together encode the full payload into a single codeword. BCH encoding can be performed by passing systematic data of the code through a shift register of the controller 110. Therefore, the systematic data can simply pass through the component encoders of the controller 110 without being modified while the shift-register advances. After the systematic data being completely passed through the shift-register, the content of the shift register is the redundancy of the code and is appended to the data stream. The same characteristics are applicable to all component encoders in all dimensions. Multi-dimensional encoding can be obtained with product codes or symmetric product codes and may provide improved capabilities. Such structures create a product of component codes to obtain a full codeword. As such, the decoding process can include iterative decoding of the component codes.

Figure 2:
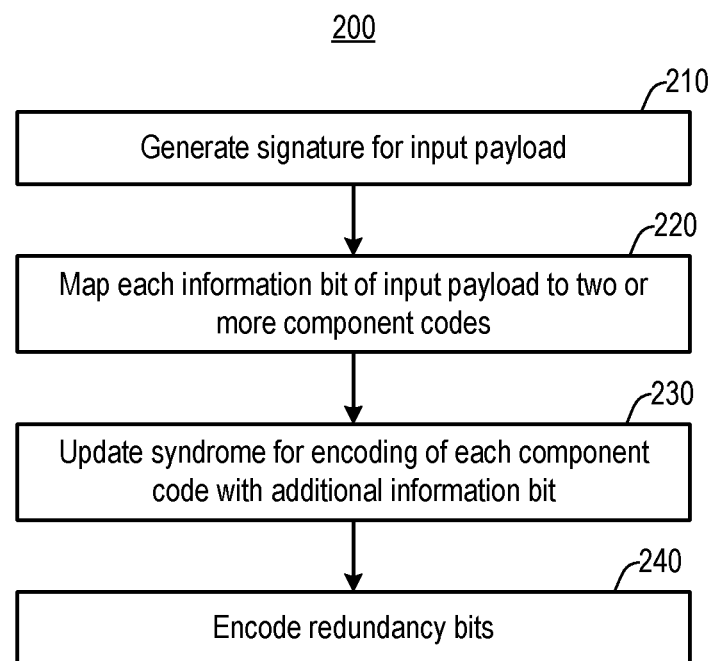
FIG. 2 is a process flow diagram illustrating an example encoding method according to some implementations.

FIG. 2 is a process flow diagram illustrating an example of an encoding method 200 according to some implementations. Referring to FIGS. 1-2, the method 200 encodes an input payload to obtain a corresponding ECC as described herein. The input payload includes information bits.

At 210, the controller 110 generates a signature for the input payload. The signature can be used during decoding to check whether decoding is successful. In some examples, the signature can be generated by passing the information bits through a hash function. In some examples, the signature includes a cyclic redundancy check-sum (CRC) generated from the information bits. In some examples, in addition to the CRC, the signature can include other indications generated from the input payload. The CRC can be generated to have a designated length. The length of the CRC can be determined based on factors such as but not limited to, target misdetection probability of the codeword decoding, misdetection probability of decoding process (alone without the CRC), and so on. Misdetection probability of the codeword decoding refers to the probability of signaling-out a "decode success" despite the existence of decode errors. Misdetection probability of decoding process (alone without the CRC) refers to the probability of signaling-out a "decode failure" despite the absence of decode errors. Some level of confidence for decoding can be provided using the component codes zero syndromes, which in some cases may be sufficient to allow a zero-length CRC. Otherwise, the CRC can be used for a combined misdetection decision. For instance, longer length of the CRC corresponds to a low misdetection probability of the codeword decoding. On the other hand, shorter length of the CRC corresponds to high target misdetection probability of the codeword decoding.

At 220, the controller 110 maps each information bit of the input payload to two or more component codes. In some examples, the bits corresponding to the signature (e.g., the CRC bits) can also encoded (e.g., each CRC bit can be mapped to one or more component codes in the arrangements in which the ECC is a regular HFPC). That is, the controller 110 implements a mapping function that maps each information bit of the input payload with corresponding component codes of the ECC. In the arrangements in which the ECC is a regular HFPC (e.g., FIG. 3), each information bit can be mapped to two component codes (e.g., i1 and i2). In the arrangements in which the ECC is an irregular HFPC (e.g., FIG. 4), at least one information bit can be mapped to three or more component codes, thus creating an irregular encoding process.

Blocks 210 and 220 can be implemented simultaneously or in parallel in some examples. In other examples, blocks 210 and 220 can be implemented sequentially in any suitable order.

The ECC code structure is composed of multiple component codes. Each component code can be, for example, a BCH code. A number of components code n can be determined by the correction capability of each component code and code rate. For example, given a minimum distance $D_{min}$ per component code, the correction capability t of each component code can be represented by:

$$t=(D_{min}-1)/2 \qquad (1).$$

where the $D_{min}$, of a linear block code is defined as the smallest Hamming distance between any pair of code vectors in the code. The number of redundancy bits r can be represented by:

$$r=Q\cdot(D_{min}-1)/2 \qquad (2);$$

where Q is a Galois field parameter for the BCH component code defined over $GF(2^Q)$. Given a code rate R and payload length K bits, a number of component codes needed can be determined by:

$$n = \left\lfloor K \cdot \frac{1-R}{r \cdot R} \right\rfloor; \text{ or} \qquad (3)$$

$$n = \left\lfloor 2K \cdot \frac{1-R}{Q \cdot (D_{min}-1) \cdot R} \right\rfloor. \qquad (4)$$

At 230, the controller 110 updates a syndrome for encoding of each component code with an additional information bit. Thus, every component code encodes a portion of the input payload, depending on the mapping function executed at 220. A set of redundancy bits corresponding to the component codes are generated after all payload bits (including the information bits and the signature bits) are encoded per blocks 210-230.

At 240, the controller 110 encodes the redundancy bits (in an additional encoding process) in some arrangements. That is, the redundancy bits can be mapped to additional code components. For example, the encoding can be obtained by a similar set of component codes. The set of component codes may be a smaller set than a set of the payload encoding set, for example, for higher code rate. Every redundancy encoding component can receive separate redundancy input bits for encoding. As such, a parity of parity encoding is generated.

Figure 3:
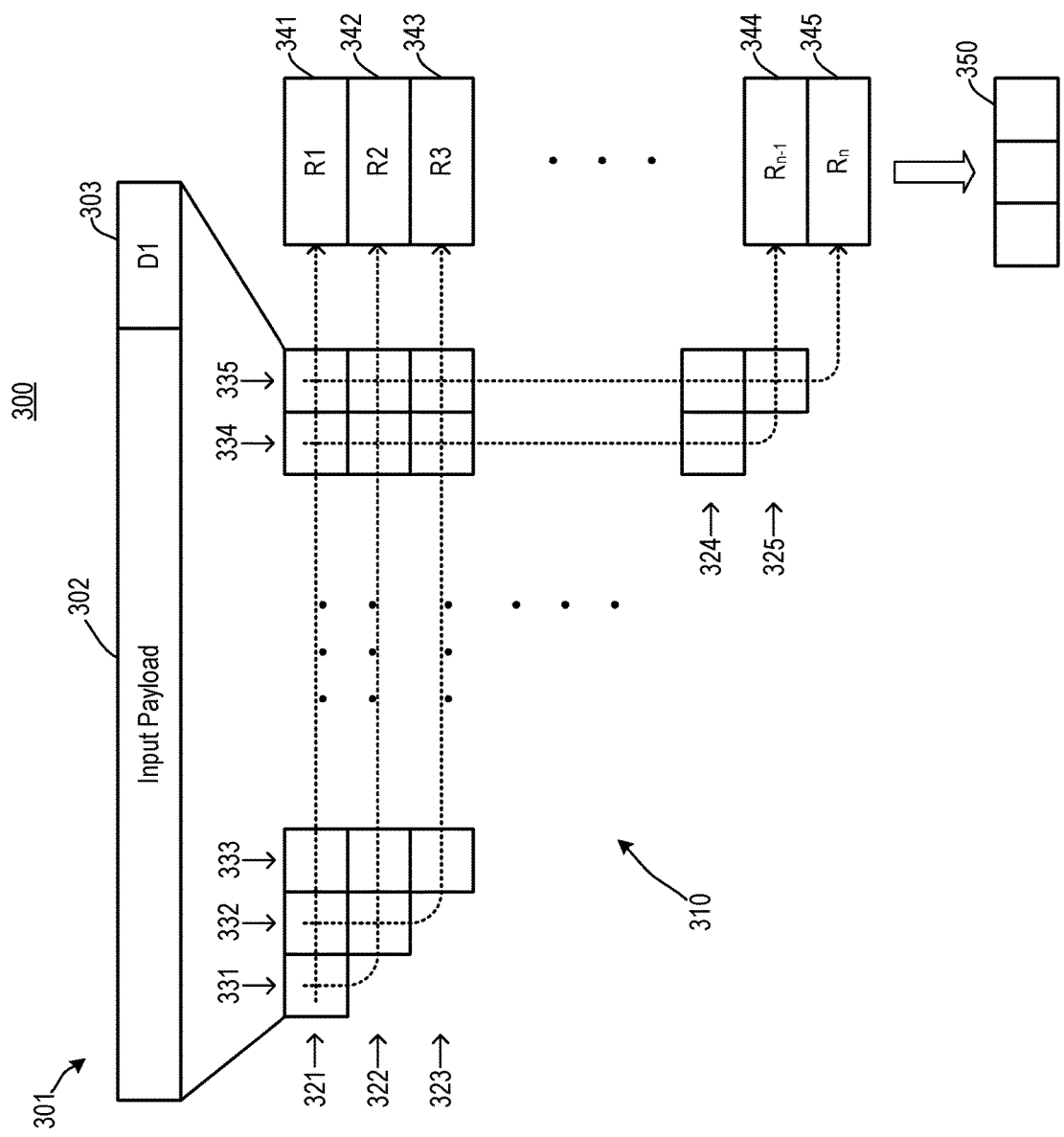
FIG. 3 is a diagram illustrating a mapping in an encoding process using a HFPC structure according to various implementations.

FIG. 3 is a diagram illustrating a mapping 300 in an encoding process using a HFPC structure according to various implementations. Referring to FIGS. 1-3, the mapping 300 corresponds to the HFPC encoding scheme and is an example implementation of block 220. The controller 110 can include or can otherwise implement an HFPC interleaver configured to organize (e.g., interleave or map) input bits 301 into a form of a pseudo triangular matrix 310. The input bits 301 include input payload 302 and signature bit(s) D1 303 in some examples. The input payload 302 includes the information bits. As described, an example of D1 303 is the extra CRC bits. The bits of D1 303 can also be referred to as "outer parity bits," given that CRC encoding can be viewed as an outer encoding process. The mapping from the input bits 301 to the pseudo triangular matrix 310 is maintained by the controller 110.

As shown, the pseudo triangular matrix 310 has an upper triangular form, which has rows 321-325 (with rows between rows 323 and 324 omitted for clarity) and column 331-335 (with columns between columns 333 and 334 omitted for clarity). The pseudo triangular matrix 310 is shown to have multiple blocks. Each block in the pseudo triangular matrix 310 includes or otherwise represents two or more bits of the input bits 301. The number of input bits per each block can be predetermined and equal for all the blocks of the pseudo triangular matrix 310. Therefore, the HFPC is obtained by allowing any pair of component codes to encode (e.g., intersect at) more than one bit. Conventionally, any pair of components HFPC intersect by only one common (intersection) bit. The disclosed implementations allow intersection of two or more common bits for any pair of component codes. The pseudo triangular matrix 310 is "pseudo" given that each row has two or more bits (e.g., a block) more than the row immediately below that row, and each column has two or more bits (e.g., a block) more than the column immediately to its left. Thus, each row or column of the pseudo triangular matrix differs from an adjacent row or column by two or more bits.

In some implementations, the input bits 301 are mapped to a block in the pseudo triangular matrix 310 consecutively (by any suitable order). For example, the rows 321-325, in that order or in a reverse order, can be filled by the input bits 301 consecutively block by block, from the left-most block of a row to a right-most block of a row, vice versa. In another example, the columns 331-335, in that order or in a reverse order, can be filled by the input bits 301 consecutively block by block, from the top-most block of a column to a bottom-most block of a row, vice versa. In some implementations, the input bits 301 are mapped to the pseudo triangular matrix 310 pseudo-randomly. In other implementations, the input bits 301 can be mapped to the pseudo triangular matrix 310 using another suitable mapping mechanism. In one embodiment, the mapping is a one to one mapping, where each bit of the input bits 301 is mapped to one bit of the pseudo triangular matrix 310 and the total number of bits in the pseudo triangular matrix 310 is equal to the number of input bits 301. In another embodiment, the mapping may be one to many, where each bit of the input bits 301 is mapped to one or more bits of the pseudo triangular matrix 310 and the total number of bits in the pseudo triangular matrix 310 is greater than the number of input bits 301.

As shown, the upper triangular form has a same number of columns and a same number of rows. In the upper triangular form, the row 321 contains the most bits out of all the rows in the pseudo triangular matrix 310. The row 322 has one less block than the row 321. The row 323 has one less block than the row 322, and so on. The row 324 has two blocks, and the row 325, being the lowest row, has one block. In other words, any row in the pseudo triangular matrix 310 (except for the row 321) has one block less than the row immediately above. Similarly, in the upper triangular form, the column 331, being the left-most column, has one block. The column 332 has one more block than the column 331. The column 333 has one more block than the column 332, and so on. The column 335, being the right-most column, has the most blocks out of the columns in the pseudo triangular matrix 310. In other words, any column in the pseudo triangular matrix 310 (except for the column 335) has one block less than the column immediately to the right.

Organizing or mapping the input bits 301 (which includes the bits of the input payload 302 and signature bit(s) D1 303) in the upper triangular form of the pseudo triangular matrix 310 allows every component code to be associated with bits in a row and a column that have the same size or nearly the same size in the manner described. For example, R1 341 represents redundancy bits corresponding to a first component code. R1 341 redundancy bits are obtained by encoding (e.g., folded component encoding) the input bits 301 in a first row (e.g., the bits in the row 321). R2 342 redundancy bits are obtained by encoding (e.g., via folded component encoding) the input bits 301 in a first column (e.g., the bits in the column 331) and the second row (e.g., the bits in the row 322). The number of total bits (e.g., the bits in the column 331 plus the bits in the row 322) encoded by R2 342 are the same as the number of total bits (e.g., the bits in the row 321) encoded by R1 341. R3 343 redundancy bits are obtained by encoding (e.g., via folded component encoding) the input bits 301 in a second column (e.g., the bits in the column 332) and the third row (e.g., the bits in the row 323). The number of total bits (e.g., the bits in the column 332 plus the bits in the row 323) encoded by R3 343 are the same as the number of total bits encoded by R2 342 (as well as the number of total bits encoded by R1 341). This process continues to obtain the last redundancy bits Rn 345, which encodes (e.g., via folded component encoding) the input bits 301 in the last column (e.g., the bits in the column 335). Thus, each component code encodes a row and a column in the pseudo triangular matrix 310, providing folded component encoding. An example of the folded component encoding is folded BCH encoding.

In other words, according to the mapping 300, the input bits 301 are mapped to the component codes of the ECC and are encoded as the mapped component codes. For example, the encoding process organizes or maps the input bits 301 in a matrix (e.g., the pseudo triangular matrix form), and performs folded BCH encoding for every component code. Each of the input bits 301 is encoded by two component codes. Each component code intersects with all other component codes. For component codes that encode the input bits 301, the encoding process is performed such that the systematic bits of every component code is also encoded by all other component codes. The input bits encoded by any of the component codes are also encoded by every other component code in the ECC in a non-overlapping manner. For example, the bits encoded by the component code corresponding to R3 343 redundancy bits are also encoded by other component codes corresponding to R1 341, R2 342, and R4-Rn 345. The bits at intersection of the row 321 and the column 332 are also encoded by the component code corresponding to R1 341; the bits at the intersection of the row 322 and the column 332 are also encoded by the component code corresponding to R2 342; the bits at the intersection of the row 323 and the column 334 are also encoded by the component code corresponding to Rn-1 344; the bits at the intersection of the row 323 and the column 335 are also encoded by the component code corresponding to Rn 345. Each block of bits encoded by any of the component code (e.g., the component code corresponding to the R3 343) is encoded by that component code (e.g., the component code corresponding to the R3 343) and no more than another one of the component codes, hence in a non-overlapping manner. As such, every component code is mutually dependent on all other component codes. The component codes together provide the encoding of each of the input bits 301 using two component codes. The component codes have the same code rate given that each component code encodes a same number of bits.

In some implementations, parity bits can be generated via parity encoding. For example, folded parity encoding can be used to encode at least a portion of each of R1 341-Rn 345 into another component code (e.g., a folded product code 350, which is a set of packets). The folded product code 350 is comprised of the parity bits. This method of generating the parity bits can be efficient for obtaining simple hardware encoding implementations of HFPC, as the method can be iteratively decoded using various methods of hard or soft decoding.

In some examples, to provide an efficient structure, an incomplete portion (e.g., not an entirety) of each of R1 341-Rn 345 is encoded to obtain the folded product code 350. This is because only the encoded versions of the input bits 301 (e.g., the input payload 302) needs to be decoded—decoding all of the redundancy bits R1 341-Rn 345 may prolong decoding time.

Figure 4:
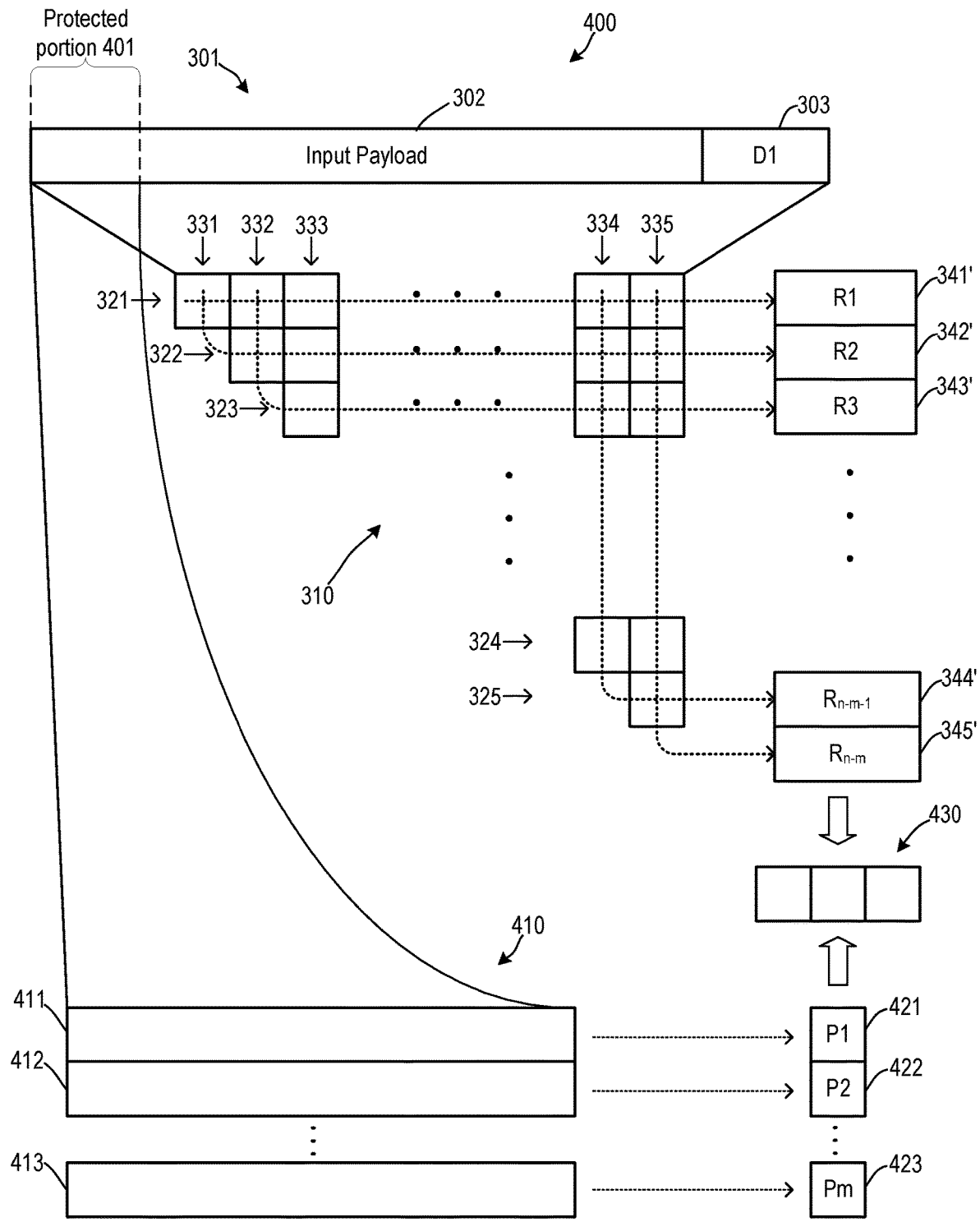
FIG. 4 is a diagram illustrating a mapping in an encoding process using an irregular HFPC structure according to various implementations.

In some arrangements, the degree of protection for some information bits can be more than two by leveraging irregular half folded-product code encoding. For example, in addition to encoding the regular half folded-product code as described with reference to FIGS. 3, an additional encoding process can be applied to some of the input bits 301 by encoding those bits with a different set of component codes. In some examples, the irregularity of the encoding process is caused by some of the input bits 301 being encoded by more than two component codes while other bits of the input bits 301 are encoded by two component codes, creating an unequal error protection of the bits within the codeword and resulting in improved correction capabilities (as applied to iterative decoding). In that regard, FIG. 4 is a diagram illustrating a mapping 400 in an encoding process using an irregular HFPC structure according to various implementations.

Referring to FIGS. 1-4, the mapping 400 corresponds to the irregular HFPC encoding scheme and is an example implementation of block 220. The controller 110 can include or can otherwise implement an HFPC interleaver configured to organize (e.g., interleave or map) the input bits 301 into the pseudo triangular matrix 310 as described in connection with FIG. 4. Redundancy bits R1 341', R2 342', R3 343', ..., Rn-m-1 344', and Rn-m 345' are generated in a manner similar to that by which R1 341-Rn 345 are generated per FIG. 3. For example, the last redundancy bits Rn-m 345', which encodes (e.g., via folded component encoding) the input bits 301 in the last column (e.g., the bits in the column 335).

In some examples, the input bits 301 include a protected portion 401 (a "3D protected payload part"). The protected portion 401 contains one or more bits can be any part of the input bits 301 that may need additional error correction protection (e.g., the protected portion 401 is known to be prone to errors).

The redundancy bits R1 341'-Rn-m 345' generated from the HFPC encoding process described with respect to FIG. 3 can be encoded by another, separate set of component codes used to encode all or a subset of these redundancy bits by another set of code components. The protected portion 401 can be encoded (in addition to being encoded based on the pseudo triangular matrix 310 as described) using a separate set of component codes. As shown, the protected portion 401 can be encoded using a mapping 410 different from the HFPC mapping of the pseudo triangular matrix 310 to create bits 411, 412, ..., 413 (the bits between 412 and 413 are omitted for brevity). The mapping 410 creates m sets of redundancy bits P1 421, P2 422, ..., Pm 423.

Thus, the bits in the protect portion 401 can be protected by three component codes—two based on the HFPC mapping of the pseudo triangular matrix 310 and another based on the mapping process 410. This additional mapping process 410 thus provides added protection of the protected portion 401, providing an improved starting capability of iterative decoding processes, leading to higher decoding capabilities, and resulting in a low-complexity encoding process.

In some implementations, parity bits (e.g., a folded product code 430) can be generated via parity encoding. For example, folded parity encoding can be used to encode at least a portion of each of R1 341'-Rn-m 345' and at least a portion of each of P1 421-Pm 423 into another component code (e.g., the folded product code 430, which is a set of packets). For example, the component code obtained by using folded parity encoding of at least a portion of each of R1 341'-Rn-m 345' may be added to the component code obtained by using folded parity encoding of at least a portion of each of R1 341'-Rn-m 345' to generate the folded product code 430.

As shown, the bits for each component code depend on the bits for another component code during decoding in the ECC structure corresponding to the mappings 300 and 400. In other implementations, multiple component codes can be grouped together and function like a single element according to the HFPC structures such that no dependency exists among the bits of the component codes within each group of component codes. Such encoding scheme reduces dependency of the HFPC structure and enables faster decoding implementation in hardware given that the encoding scheme is a low-complexity encoding and decoding code structure obtained by defining groups, where each group includes independent components.

Figure 5:
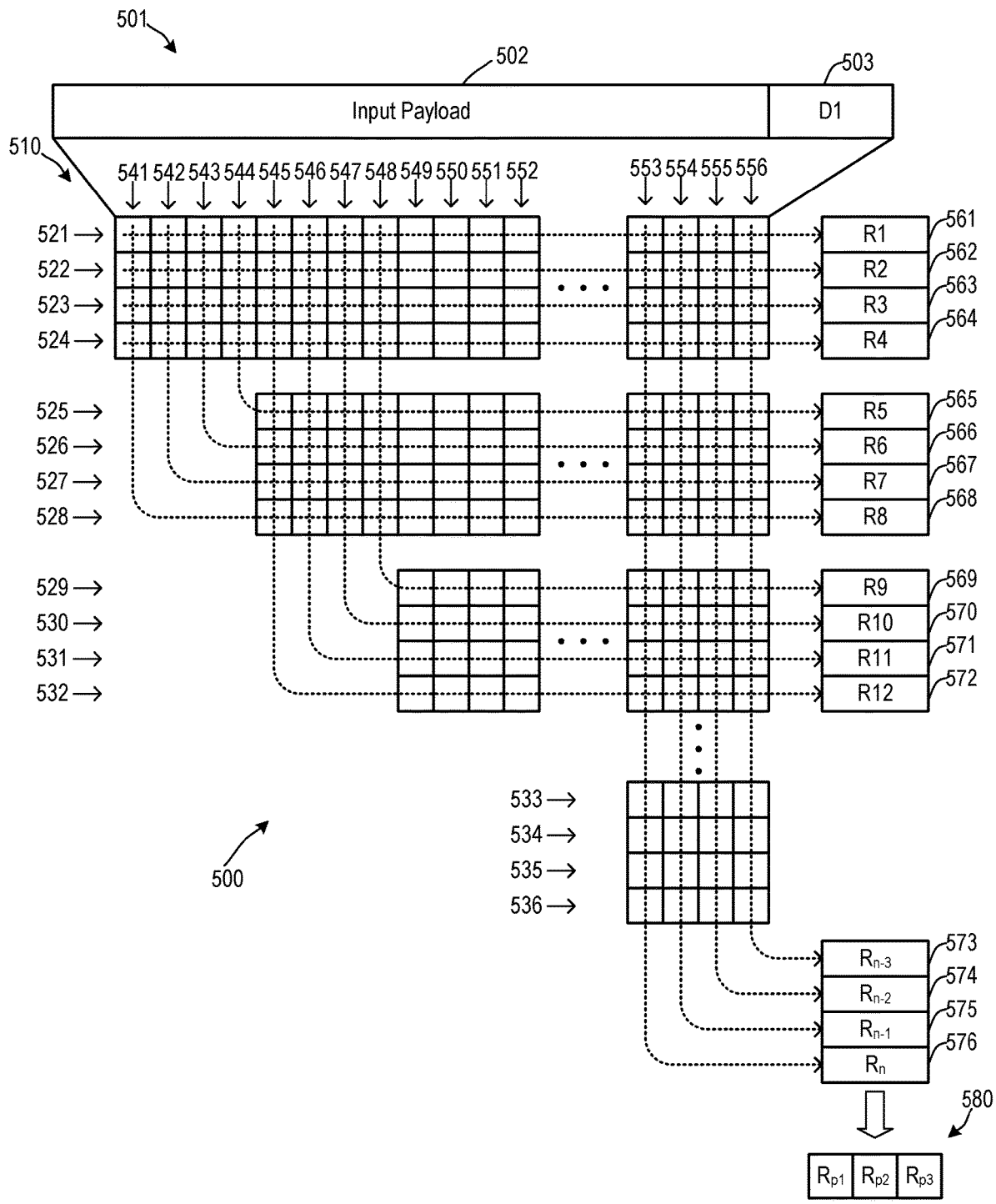
FIG. 5 is a diagram illustrating a mapping in an encoding process using a group HFPC structure according to various implementations.

In that regard, FIG. 5 is a diagram illustrating a mapping 500 in an encoding process using a group HFPC structure according to various implementations. Referring to FIGS. 1-5, the mapping 500 corresponds to the group HFPC encoding scheme and is an example implementation of block 220. The HFPC interleaver of the controller 110 is configured to organize (e.g., interleave) input bits 501 into a form of a pseudo triangular matrix 510. The input bits 501 includes input payload 502 and signature bit(s) D1 503 in some examples. The input payload 502 includes the information bits. As described, an example of D1 503 is the extra CRC bits (outer parity bits). The mapping from the input bits 501 to the pseudo triangular matrix 510 is maintained by the controller 110.

As shown, the pseudo triangular matrix 510 has an upper triangular form, which has rows 521-536 (with rows between rows 532 and 533 omitted for clarity) and columns 541-556 (with columns between columns 552 and 553 omitted for clarity). The pseudo triangular matrix 510 is shown to have multiple blocks. Each block in the pseudo triangular matrix 510 includes or otherwise represents two or more bits of the input bits 501. The number of input bits per each block can be predetermined and equal for all the blocks of the pseudo triangular matrix 510. The disclosed implementations allow intersection of two or more common bits for any pair of component codes.

In some implementations, the input bits 501 are mapped to blocks in the pseudo triangular matrix 510 consecutively (by any suitable order). For example, the rows 521-536, in that order or in a reverse order, can be filled by the input bits 501 consecutively block-by-block, from the left-most block of a row to a right-most block of a row, or vice versa. In another example, the columns 541-556, in that order or in a reverse order, can be filled by the input bits 501 consecutively block-by-block, from the top-most block of a column to a bottom-most block of a row, or vice versa. In some implementations, the input bits 501 are mapped to the pseudo triangular matrix 510 pseudo-randomly. In other implementations, the input bits 501 can be mapped to the pseudo triangular matrix 510 using another suitable mapping mechanism.

The blocks, rows, and columns in the pseudo triangular matrix 510 can be grouped together. For example, the pseudo triangular matrix 510 includes a first group of columns 541-544, a second group of columns 545-548, a third group of columns 549-552, ..., and another group of columns 553-556. The pseudo triangular matrix 510 includes a first group of rows 521-524, a second group of rows 525-528, a third group of rows 529-532, ..., and another group of rows 533-536. Thus, the HFPC structure is divided into groups of 4 component codes. Every 4 component codes are encoded according to HFPC guidelines. Although 4 component code groups (e.g., 4 rows/columns) are shown in FIG. 5, any number (e.g., 2, 3, 6, 8, 10, 12, 16, and so on) of component codes can be grouped together.

As shown, the upper triangular form has a same number of columns and a same number of rows. The rows (e.g., the rows 521-524) or columns (e.g., the columns 541-544) in a same component code group have a same number of blocks and therefore have a same number of bits. In the upper triangular form, the rows 521-524 contain the most bits out of all the rows in the pseudo triangular matrix 510. Each of the rows 525-528 has one less group of blocks (4 blocks, corresponding to the group of columns 541-544) than any of the rows 521-524. Each of the rows 529-532 has one less group of blocks (4 blocks, corresponding to the group of columns 545-548) than any of the rows 525-528, and so on. Each of the rows 533-536, being the lowest row, has a group of blocks (e.g., 4 blocks). In other words, any row in the pseudo triangular matrix 510 (except for the rows 521-524) has 4 blocks less than a row of a group immediately above. Similarly, in the upper triangular form, each of the columns 541-544, being one of the left-most columns, has a group of blocks (e.g., 4 blocks). Each of the columns 545-548 has one more group of blocks (4 blocks, corresponding to the group of rows 525-528) than any of the columns 541-544. Each of the columns 549-552 has one more group of blocks (4 blocks, corresponding to the group of rows 529-532) than any of the columns 545-548, and so on. Each of the columns 553-556, being the right-most columns, has the most number of blocks. In other words, any column in the pseudo triangular matrix 510 (except for the columns 553-556) has 4 blocks less than a column of a group immediately to the right.

Organizing or mapping the input bits 501 in the upper triangular form of the pseudo triangular matrix 510 allows every component code to be associated with bits in a row and a column that have the same size or nearly the same size in the manner described. The component codes within a same group encode separate sets of the input bits 501 and are independent of each other.

R1 561-R4 564 are redundancy bits determined based on a same group of component codes. R1 561 represents redundancy bits corresponding to a first component code and are obtained by encoding (e.g., folded component encoding) the input bits 501 in a first row (e.g., the bits in the row 521). R2 562, R3 563, and R4 564 represent redundancy bits corresponding to additional component codes and are obtained by encoding (e.g., folded component encoding) the input bits 501 in the bits in the rows 522, 523, and 523, respectively. The bits used to determine each of R1 561-R4 564 do not overlap, and thus R1 561-R4 564 are independently determined.

R5 565, R6 566, R7 567, and R8 568 represent redundancy bits corresponding to additional component codes and are obtained by encoding (e.g., folded component encoding) the input bits 501 in the bits in the column 544 and row 525, in the column 543 and row 526, in the column 542 and row 527, and in the column 541 and row 528, respectively. The bits used to determine each of R5 565-R8 568 do not overlap, and thus R5 565-R8 568 are independently determined.

R9 569, R10 570, R11 571, and R12 572 represent redundancy bits corresponding to additional component codes and are obtained by encoding (e.g., folded component encoding) the input bits 501 in the bits in the column 548 and row 529, in the column 547 and row 530, in the column 546 and row 531, and in the column 545 and row 532, respectively. The bits used to determine each of R9 569-R12 572 do not overlap, and thus R9 569-R12 572 are independently determined.

This process continues until Rn-3 573, Rn-2 574, Rn-1 575, and Rn 576 are determined. Rn-3 573, Rn-2 574, Rn-1 575, and Rn 576 represent redundancy bits corresponding to additional component codes and are obtained by encoding (e.g., folded component encoding) the input bits 501 in the bits in the column 556, in the column 555, in the column 554, and in the column 553, respectively. The bits used to determine each of Rn-3 573, Rn-2 574, Rn-1 575, and Rn 576 do not overlap, and thus Rn-3 573, Rn-2 574, Rn-1 575, and Rn 576 are independently determined. An example of the folded component encoding is folded BCH encoding.

In the special case that the component codes are divided into two groups of independent component codes, the resulting coding scheme degenerates to a folded product code.

In other words, according to the mapping 500, the input bits 501 are mapped to the component codes of the ECC and are encoded as the mapped component codes. For example, the encoding process organizes or maps the input bits 501 in a matrix (e.g., a pseudo triangular matrix form), and performs folded BCH encoding for every component code. Each of the input bits 501 is encoded by two component codes of different component code groups. Thus, any component code intersects with all other component codes that are in the same group as the group to which that component code belongs. For component codes that encode the input bits 501, the encoding process is performed such that the systematic bits of every component code is also encoded by all other component codes that belong to different groups, with dependency within a component code group being eliminated. The input bits encoded by a given component code of the component codes are also encoded by every other component code (that is not in the same group as that component code) in a non-overlapping manner. For example, the bits encoded by the component code corresponding to R9 569 redundancy bits are also encoded by other component codes corresponding to R1 561-R8 568 and R11-Rn 576 that are not in the group in which the component code corresponding to R9 569 redundancy bits belongs. Each block of bits encoded by any of the component code (e.g., the component code corresponding to the R9 569) is encoded by that component code (e.g., the component code corresponding to the R9 569) and no more than another one of the component codes, hence in a non-overlapping manner. As such, every component code is mutually dependent on all other component codes that are not within the same group. The component codes together provide the encoding of each input bits 501 using two component codes.

In some implementations, parity bits can be generated via parity encoding. For example, folded parity encoding can be used to encode at least a portion of each of R1 561-Rn 576 into another component code (e.g., a folded product code 580, which is a set of packets). The folded product code 580 (e.g., having Rp1-Rp3) is the parity bits. This method of generating the parity bits can be efficient for obtaining simple hardware encoding implementations of HFPC, as the method can be iteratively decoded using various methods of hard or soft decoding.

Further disclosure with respect to the ECC structure described herein is described, titled "ERROR CORRECTION CODE STRUCTURE," filed on [XXXX], which is hereby incorporated by reference in its entirety.

Relative to decoding the data encoded using the ECC structures described herein, iterative soft decoding for HFPC can be efficiently provided by computing and applying extrinsic information for every decoded component.

In addition, by applying false correction minimization of component decoding within a general product code, hard decoding can be performed at low complexity, thus improving reliability. The false correction minimization of component decoding within a general product code includes detection and implementation, rejection of suspicious and contradicting solutions of component codes, inclusion of forcing bit for solved component codes, and so on.

In some arrangements, safe decoding based on the ECC structures described herein can be used to reduced false correction during the decode process. That is, efficiency of iterative decoding of the HFPC structures can be improved by detecting false corrections of component codes using mutual dependency defined by the ECC structures, thus allowing performance of valid corrections while disregarding invalid corrections. The HFPC structures described herein improve decoding convergence time as all component codes (not only half of the component codes) of the HFPC are mutually dependent. Therefore, every component decoding correction can be used to improve probability of decode success for at least another component code. In other words, propagation of error fixes can be highly efficient in HFPC structures, thus improving decoding throughput.

In some arrangements, safe decoding can lower the false correction probability by resolving contradicting solutions (fixes) provided by inter-dependent component codes and adding forcing flags to solutions provided by inter-dependent component codes that are in agreement. In some examples, updating of accepted component codes occurs after completion of decoding test (detection) for the component codes.

The safe decoding described herein includes a detection phase, which generally calls for two pass decoding iterations. For small BCH component codes (e.g., with error correction capability t≤4), a single-cycle implementation can be applied, and the safe decoding adds no more than one extra cycle per component code, or may even be less depending on implementation details. This indicates that the safe decoding flow maintains efficient decoding throughput together with reliability.

For hard decoding, safe decoding decision rules can be used to evaluated suggested corrections obtained from inner decoding of all component codes. Based on the interdependency of the component codes (e.g., whether the proposed corrections of mutually dependent component codes agree or contradict with each other), the safe decoding decision rules result in decisions to implement or reject component solutions (e.g., the suggested corrections) in view of the complete set components hypotheses suggestions. Therefore, the safe decoding decision rules can be applied/evaluated after the inner decoding of all component codes are completed and before implementation of any of the suggested corrections obtained by the inner decoding of all component codes.

In some examples, the safe decoding decision rules includes a strong accept rule, a first rejection rule, a second rejection rule, and a third rejection rule. Such rules are exemplary, and any other suitable dependency-based safe decoding decision rules can be likewise implemented based on implementation details. In some examples, the strong accept rule, the first rejection rule, the second rejection rule, and the third rejection rule, in that order, are applied to the suggested corrections obtained from inner decoding of all component codes. In other examples, the strong accept rule, the first rejection rule, the second rejection rule, and the third rejection rule can be applied to the suggested corrections obtained from inner decoding of all component codes in any other suitable order.

In some examples, the strong accept rule applies in a scenario in which at least two or all of the component codes that intersect at a block agree on a same suggested correction for the bits in that block. The number of the interdependent component codes that intersect at the block can be two or more. During error detection in the decoding process, at least two or all of the component codes that intersect at a block suggest corrections that have at least one common bit within the intersection block. The component codes that intersect at a block are referred to as cross component codes. Such component codes being in agreement is indicative of a high probability that the suggest correction is a reliable solution. Therefore, in response to determining that the strong accept rule is met (e.g., at least two or all of the component codes that intersect at the block agree on a same suggested correction for the block), the suggested correction is forced. As used herein, forcing a suggested correction refers to association of corrections (e.g., corresponding to a strong accept) with high reliability and use the syndromes of such corrections to reject other contradicting suggested corrections. No cross-decoding can revert the forced correction. Other suggested corrections to the one or more bits or to other bits that are corrected by the component codes are rejected (not implementing a component decoding result (e.g., suggested corrections) due to one of the rejections criteria described herein). As such, a strong accept condition is met if at least one suggested error of different component code is the same. The number of agreeing component codes and the minimal number of agreed bits of the suggested errors can be determined by configuration of the specific code rate, and component type.

Figure 6A:
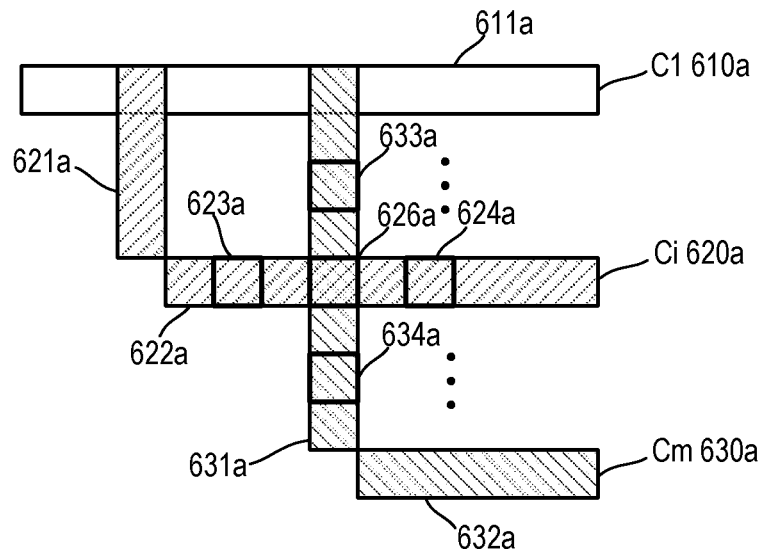
FIG. 6A is a diagram illustrating a decoding scenario in which two component codes indicate suggested corrections that are in agreement, according to various implementations.

In that regard, FIG. 6A is a diagram illustrating a decoding scenario in which two component codes indicate suggested corrections that are in agreement, according to various implementations. Referring to FIGS. 1-6A, an ECC structure 600a shown in FIG. 6A can be implemented based on mappings such as but not limited to, the mappings 300, 400, and 500. That is, the ECC structure 600a may be the result of mapping input bits (e.g., the input bits 301 and 501) to a pseudo triangular matrix (e.g., the pseudo triangular matrices 310 and 510). Interdependent component codes are used to encode and decode the input bits based on the ECC structure 600a similar to described with respect to the mappings 300, 400, and 500. For example, the input bits in row 611a are encoded/decoded using component code C1 610a (e.g., the row 611a may correspond to the row 321 or 521, where R1 341 or 561 is determined based on C1 610a). The input bits in column 621a and row 622a are encoded/decoded using component code Ci 620a (e.g., the column 621a may correspond to the column 332 or 542, the row 622a may correspond to the row 323 or 527, respectively, where R3 343 or R7 567 is determined based on Ci 620a). The input bits in column 631a and row 632a are encoded/decoded using component code Cm 630a (e.g., the column 631a may correspond to the column 334 or 548, the row 632a may correspond to the row 325 or 529, respectively, where Rn-1 344 or R9 569 is determined based on Cm 630a). Each of C1 610a, Ci 620a, and Cm 630a can be a BCH component code. For the sake of clarity, other component codes (and rows and columns associated thereof) and blocks other than those with suggested corrections are omitted.

Error detection using Ci 620a yields suggested corrections at blocks 623a, 626a, and 624a. As used herein, a suggested correction refers to a suggested correction for one of multiple bits in a given block. Each block contains multiple bits, and a suggested correction corresponds to one of those multiple bits. Error detection using Cm 630a yields suggested corrections at blocks 633a, 626a, and 634a. Error detection using Ci 620a and Cm 630a are performed independently. Therefore, Ci 620a and Cm 630a agree on the suggested correction at block 626a, and the strong accept rule applies. All suggested corrections by Ci 620a and Cm 630a are forced and fixed (accepted). That is, in addition to the suggested correction at block 626a, the suggested corrections at blocks 623a, 624a, 633a, and 634a are also forced and fixed (accepted). All other solutions to any blocks (e.g., any blocks in the columns 621a and 631a and rows 622a and 632a) corresponding to Ci 620a and Cm 630a are rejected.

In some examples, the first rejection rule (Rejection Type One) applies in a scenario in which a current component code indicates suggested corrections to correct exactly t (error correction capability of a BCH component code) errors and to undo n≥$TH_z$ cross component zero syndromes (or about to be zero syndromes). IN some examples, $TH_z$ can be 1, which means that Rejection Type One can be applied in response to determining that the suggested correction attempts to undo at least one zero syndrome of cross components. This means that a component solution (e.g., the suggested correction) may include changing a zero syndrome of $TH_z$ components or more. This scenario corresponds to a high probability of false correction and the suggested corrections may be rejected based on the first rejection rule.

Figure 6B:
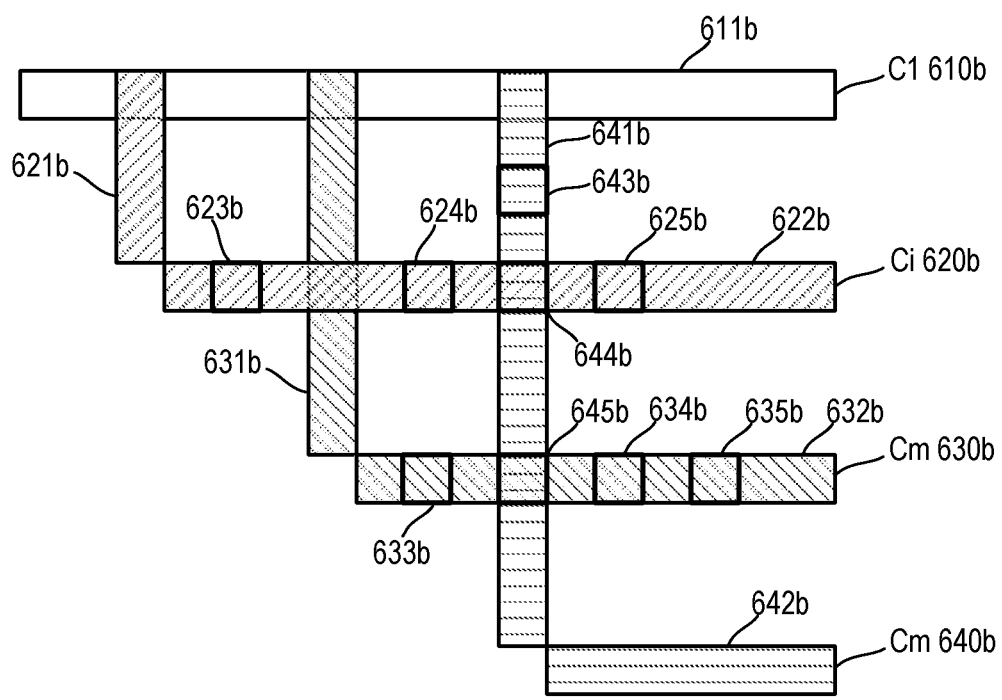
FIG. 6B is a diagram illustrating a decoding scenario in which suggested corrections of a component code are rejected, according to various implementations.

In that regard, FIG. 6B is a diagram illustrating a decoding scenario in which suggested corrections of a component code are rejected, according to various implementations. Referring to FIGS. 1-6B, an ECC structure 600b shown in FIG. 6B can be implemented based on based on mappings such as but not limited to, the mappings 300, 400, and 500. That is, the ECC structure 600b may be the result of mapping input bits (e.g., the input bits 301 and 501) to a pseudo triangular matrix (e.g., the pseudo triangular matrices 310 and 510). Interdependent component codes are used to encode and decode the input bits based on the ECC structure 600b similar to described with respect to the mappings 300, 400, and 500. For example, the input bits in row 611b are encoded/decoded using component code C1 610b (e.g., the row 611b may correspond to the row 321 or 521, where R1 341 or 561 is determined based on C1 610b). The input bits in column 621b and row 622b are encoded/decoded using component code Ci 620b (e.g., the column 621b may correspond to the column 332 or 542, the row 622b may correspond to the row 323 or 527, respectively, where R3 343 or R7 567 is determined based on Ci 620b). The input bits in column 641b and row 642b are encoded/decoded using component code Cm 640b (e.g., the column 641b may correspond to the column 334 or 548, the row 642b may correspond to the row 325 or 529, respectively, where Rn-1 344 or R9 569 is determined based on Cm 640b). The input bits in column 631b and row 632b are encoded/decoded using component code Cj 630b (e.g., the column 631b may correspond to another column in the pseudo triangular matrix 310 or 510, the row 632b may correspond to another row in the pseudo triangular matrix 310 or 510, respectively, where corresponding redundancy bits are determined based on Cj 630b). Each of C1 610b, Ci 620b, Cj 630b, and Cm 640b can be a BCH component code. For the sake of clarity, other component codes (and rows and columns associated thereof) and blocks other than those with suggested corrections are omitted.

Each of Ci 620b, Cj 630b, and Cm 640b has an error correction capability of t=3 errors. The component Cm 640b is attempting to fix 3 errors (e.g., 3 suggested corrections at blocks 643b, 644b, and 645b) while two other cross component codes Ci 620b and Cj 630b are attempting to fix errors on other locations or blocks in the cross packets. Ci 620b and Cj 630b are cross component codes to Cm 640b given that Cm 640b intersects with both Ci 620b and Cj 630b at block 644b and 645b, respectively. For example, error detection using Ci 620b yields suggested corrections at blocks 623b, 624b, and 625b. Error detection using Cj 630b yields suggested corrections at blocks 633b, 634b, and 635b. Error detection using Ci 620b, Cj 630b, and Cm 640b are performed independently. Despite that Ci 620b and Cj 630b intersect with Cm 640b at blocks 644b and 645b, Ci 620b and Cj 630b do not agree with the suggested corrections at blocks 644b and 645b by Cm 640b. Therefore, the first rejection rule applies, causing a rejection on all of the suggested corrections (e.g., at blocks 643b, 644b, and 645b) by Cm 640b.

In some examples, the second rejection rule (Rejection Type Two) applies in a scenario in which a current component code indicates suggested corrections to correct t (error correction capability) errors while a cross component code of the current component code indicates a suggested correction to correct an error at a block belonging to the current component code, where that block is not one of the t errors indicated by the current component code. In other words, with respect to a location (e.g., a block) that the current component code and the another component code intersect, the current component code does not find an error while the another component code finds an error. In this case, the suggested corrections indicated by the current component code are rejected based on the second rejection rule.

Figure 6C:
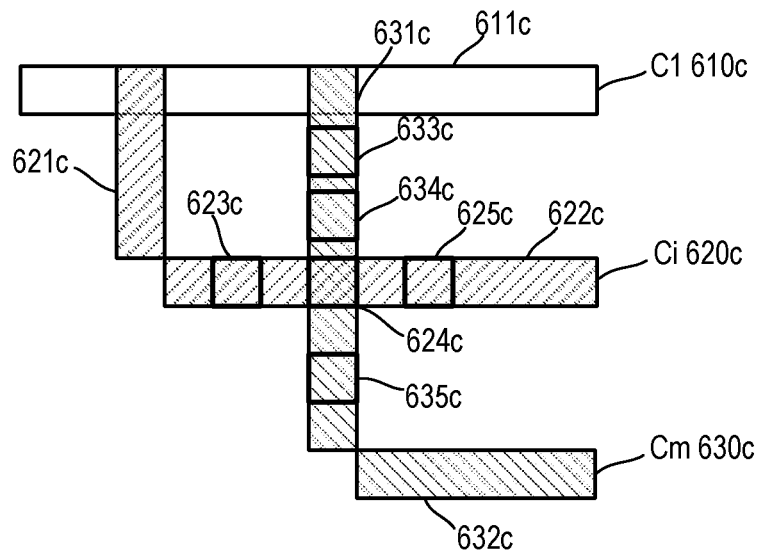
FIG. 6C is a diagram illustrating a decoding scenario in which suggested corrections of a component code are rejected, according to various implementations.

In that regard, FIG. 6C is a diagram illustrating a decoding scenario in which suggested corrections of a component code are rejected, according to various implementations. Referring to FIGS. 1-6C, an ECC structure 600c shown in FIG. 6C can be implemented based on mappings such as but not limited to, the mappings 300, 400, and 500. That is, the ECC structure 600c may be the result of mapping input bits (e.g., the input bits 301 and 501) to a pseudo triangular matrix (e.g., the pseudo triangular matrices 310 and 510). Interdependent component codes are used to encode and decode the input bits based on the ECC structure 600c similar to described with respect to the mappings 300, 400, and 500. For example, the input bits in row 611c are encoded/decoded using component code C1 610c (e.g., the row 611c may correspond to the row 321 or 521, where R1 341 or 561 is determined based on C1 610c). The input bits in column 621c and row 622c are encoded/decoded using component code Ci 620c (e.g., the column 621c may correspond to the column 332 or 542, the row 622c may correspond to the row 323 or 527, respectively, where R3 343 or R7 567 is determined based on Ci 620c). The input bits in column 631c and row 632c are encoded/decoded using component code Cm 630c (e.g., the column 631c may correspond to the column 334 or 548, the row 632c may correspond to the row 325 or 529, respectively, where Rn-1 344 or R9 569 is determined based on Cm 630c). Each of C1 610c, Ci 620c, and Cm 630c can be a BCH component code. For the sake of clarity, other component codes (and rows and columns associated thereof) and blocks other than those with suggested corrections are omitted.

Each of Ci 620c and Cm 630c has an error correction capability of t=3 errors. The component Cm 630c is attempting to fix 3 errors (e.g., 3 suggested corrections at blocks 633c, 634c, and 635c). Error detection using the cross component Ci 620c yields suggested corrections at blocks 623c, 624c, and 625c. Ci 620c and Cm 630c are cross component codes to each other given that Ci 620c intersects with Cm 630c at block 624c. Error detection using Ci 620c and Cm 630c are performed independently. Despite that Ci 620c and Cm 630c intersect at block 624c, Ci 620c and Cm 630c do not agree given that the suggested errors (up to the error correction capability) at blocks 633c, 634c, and 635c indicated by Cm 630c does not include one in block 624c, while Ci 620c indicates a suggested error at block 624c. Therefore, the second rejection rule applies, causing a rejection on all of the suggested corrections (e.g., at blocks 633c, 634c, and 635c) by Cm 630c.

In some examples, the third rejection rule (Rejection Type Three) applies in a scenario in which a current component code indicates fewer suggested errors that those indicated by a cross component code of the current component code. In this scenario, the cross component solution (e.g., the suggested errors indicated by the cross component code) is rejected. The cross component is rejected because probability of false correction may be higher for valid solutions with more error locations for BCH codes.

Figure 6D:
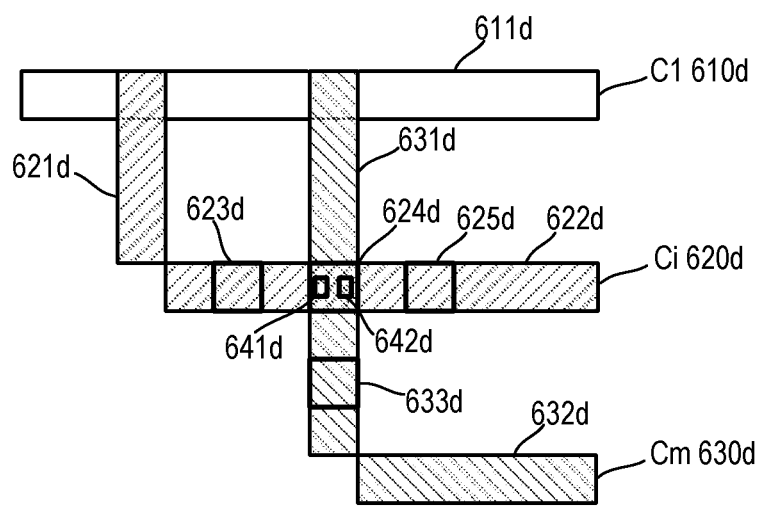
FIG. 6D is a diagram illustrating a decoding scenario in which suggested corrections of a component code are rejected, according to various implementations.

In that regard, FIG. 6D is a diagram illustrating a decoding scenario in which suggested corrections of a component code are rejected, according to various implementations. Referring to FIGS. 1-6D, an ECC structure 600d shown in FIG. 6D can be implemented based on mappings such as but not limited to, the mappings 300, 400, and 500. That is, the ECC structure 600d may be the result of mapping input bits (e.g., the input bits 301 and 501) to a pseudo triangular matrix (e.g., the pseudo triangular matrices 310 and 510). Interdependent component codes are used to encode and decode the input bits based on the ECC structure 600d similar to described with respect to the mappings 300, 400, and 500. For example, the input bits in row 611d are encoded/decoded using component code C1 610d (e.g., the row 611d may correspond to the row 321 or 521, where R1 341 or 561 is determined based on C1 610d). The input bits in column 621d and row 622d are encoded/decoded using component code Ci 620d (e.g., the column 621d may correspond to the column 332 or 542, the row 622d may correspond to the row 323 or 527, respectively, where R3 343 or R7 567 is determined based on Ci 620d). The input bits in column 631d and row 632d are encoded/decoded using component code Cm 630d (e.g., the column 631d may correspond to the column 334 or 548, the row 632d may correspond to the row 325 or 529, respectively, where Rn-1 344 or R9 569 is determined based on Cm 630d). Each of C1 610d, Ci 620d, and Cm 630d can be a BCH component code. For the sake of clarity, other component codes (and rows and columns associated thereof) and blocks other than those with suggested corrections are omitted.

Each of Ci 620d and Cm 630d has an error correction capability of t=3 errors. The component Cm 630d is attempting to fix 2 errors (e.g., 2 suggested corrections at blocks 624d and 633d). Error detection using the cross component Ci 620d yields suggested corrections at blocks 623d, 624d, and 625d. Ci 620d and Cm 630d are cross component codes to each other given that Ci 620d intersects with Cm 630d at block 624d. Ci 620d attempts to fix a first error bit 641d in block 624d while Cm 630d attempts to fix a second error bit 642d in block 624d, the first error bit 641d and the second error bit 642d being different bits in the block 624d. Cm 630d indicates one less suggested errors than Ci 620d. In other words, the first set of the suggested corrections and the second set of the suggested corrections do not have any suggested correction in common. Therefore, the third rejection rule applies, and Ci 620d and Cm 630d do not agree. All of the suggested corrections (e.g., at block 623d, for the first error bit 641d in block 624d, and block 625d) by Ci 620d are rejected while the suggested corrections (e.g., at the second error bit 642d in block 624d and at block 633d) indicated by Cm 630d are forced and fixed (accepted).

Figure 7:
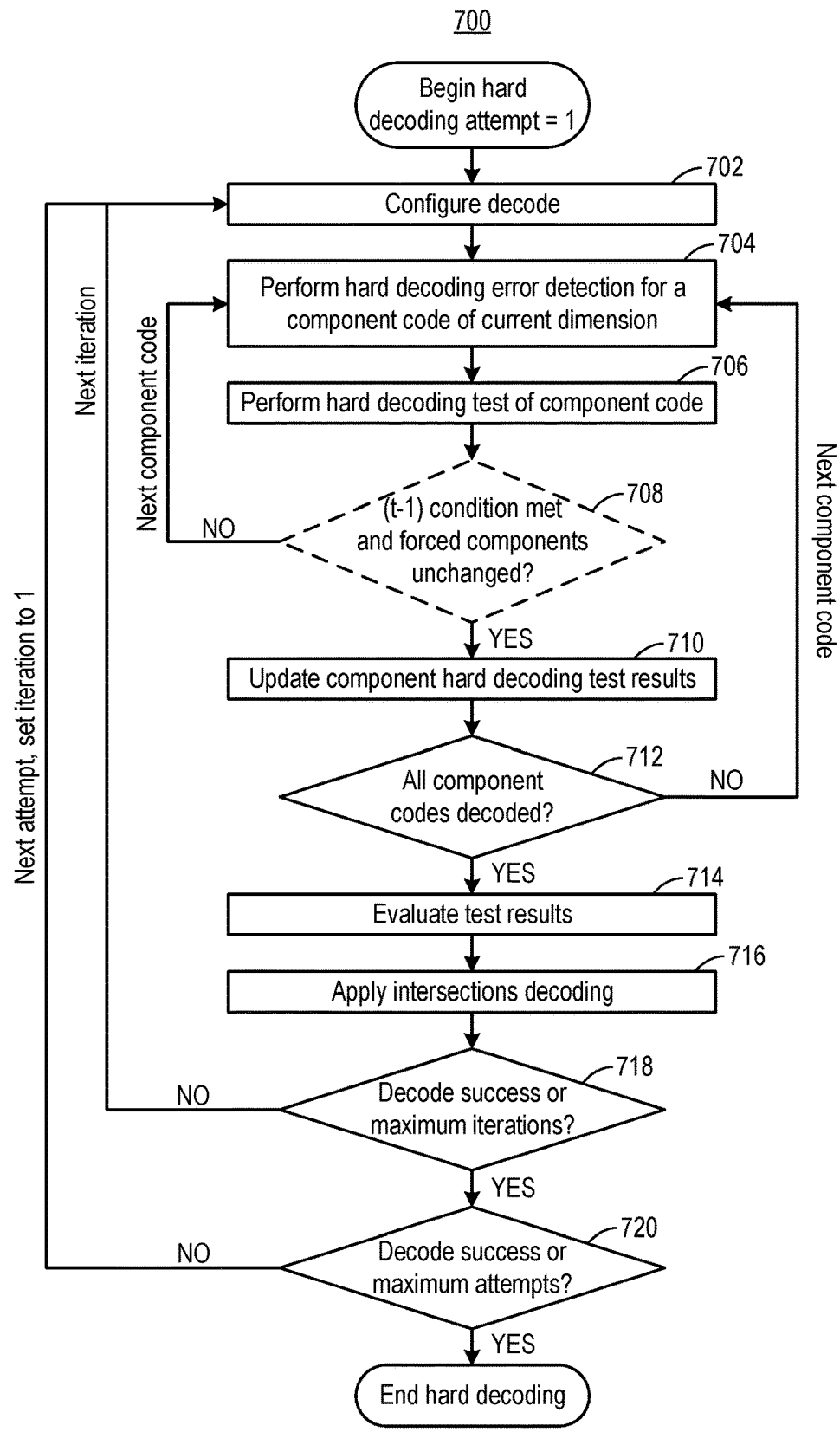
FIG. 7 is a process flow diagram illustrating an example hard decoding method, according to various implementations.

FIG. 7 is a process flow diagram illustrating an example hard decoding method 700, according to various implementations. Referring to FIGS. 1-7, the hard decoding method 700 can be performed by one or more decoders (e.g., one or more HFPC iterative hard decoders) implemented by the controller 110. The hard decoding method 700 is a HFPC iterative decoding method and includes the safe decoding as described herein. The hard decoding method 700 operates on codewords, which may have errors (e.g., noise) added during read.

In some examples, in the first iteration of iterative decoding, only inner component codes are used for decoding. Sometimes the inner component codes decode only few errors (e.g. t<4 per BCH component code), thus decoding per component code can be efficient. In flash memory devices (e.g., the flash memory device 100), read performance depends on the decoder latency. Therefore, high-speed decoding is needed for high read performance. At low latency and when the number of errors is not too high, successful decoding using only iterative fast decoding is possible without the safe decoding and/or intersections decoding. On the other hand, in the cases in which inner decoding is not successful, other types of multi-dimensional decoding can be attempted.

The hard decoding method 700 begins as a number of attempts is set to 1. At 702, the controller 110 (e.g., the decoders) configures the decode. In some examples, configuring the decode is performed once per iteration. In some examples, configuring the decode includes setting safe decoding on or off, where the method 700 includes the safe decoding responsive to the safe decoding being on, vice versa.

In some examples, configuring the decode includes setting a number of errors correctable by each component code. In some cases, the number of errors for each component code is set to t−1, which is one less than the error correction capability (t) of that component code. Setting the number of errors for each component code to t−1 minimizes the probability of false corrections when performing BCH corrections. In some examples in which BCH component codes have a decoding capability of t≤4, a direct solution from the syndromes can be applied, enabling efficient hardware implementation with high decoding throughput. Thus, a simplified approach is to perform correction of up to one error less than the BCH code correction capability t. Each component code has a code spectrum. For instance, a probability distribution P(n, e) is defined where n (e.g., 0≤n≤t) is the number of false error detection after BCH decoding, and e is the number of input errors (e.g., e>t). After decoding a BCH component code with e>t, additional errors may exist according to:

$$P_n(m) = \Sigma_{e=t+1}^{N} P(m,e) \qquad (5);$$

where N is a codeword length (including parity bits) of the component code. Thus, limiting to m corrections per component code can change every iteration with a gradually increasing false correction probability.

Limiting the number of errors to t−1 and multi-dimensional iterative decoding can each be carried out for $M_0 \geq 0$ and $M_1 \geq 0$ iterations, respectively. Whereas $M_0 = 0$, no (t−1) decoding iterations occur. Such configuration is valid for fast decoding.

In some examples, configuring the decode at 702 includes forcing component-code state, setting a number of component codes to decode per dimension, and so on.

An iteration (e.g., 702-714) in the hard decoding method 700 attempts to decode all component codes. At 704, the controller 110 (e.g., the decoders) performs hard decoding error detection for a current component code of a current dimension. At 706, the controller 110 (e.g., the decoders) performs hard decoding test for the current component code. That is, the current decoding attempt includes a test phase where all component codes are tested for decoding. Suggested corrections for each component codes are recorded (e.g., stored by the controller 110).

At 708, the controller 110 (e.g., the decoders) determines whether the t−1 condition is met and the forced components are unchanged. In some examples, block 708 is not performed in some iterations, and the t−1 condition need not be tested for those iterations. In response to determining that the t−1 condition is not met or the forced components are changed (708:NO), the method 700 returns to 704, with the current component code set to be a next component code. On the other hand, in response to determining that the t−1 condition is met and the forced components are unchanged (708:YES), the controller 110 (e.g., the decoders) updates component hard decoding test results at 710.

At 712, the controller 110 (e.g., the decoders) determines whether all component codes have been decoded and tested (and the suggested corrections recorded). Responsive to determining that not all component codes have been decoded and tested (712:NO), the method 700 returns to 704, with the current component code set to be a next component code, until all component codes have been decoded and tested.

Responsive to determining that all component codes have been decoded and tested (712:YES), the controller 110 (e.g., the decoders) evaluates the test results (e.g., the recorded suggested corrections) at 714. In other words, the decision to implement/force or reject any of the suggested corrections by all the component codes is made in view of the complete set components hypotheses suggestions, evidenced by the recorded suggested corrections for all of the component codes. The controller 110 evaluates the test results using the strong accept rule, the first rejection rule, the second rejection rule, the third rejection rule, and so on. In some examples, the controller 110 applies the strong accept rule, the first rejection rule, the second rejection rule, and the third rejection rule, in that order to the recorded suggested corrections. In other examples, the controller 110 applies the strong accept rule, the first rejection rule, the second rejection rule, and the third rejection rule to the recorded suggested corrections in any other suitable order. The controller 110 (e.g., the decoders) can force (e.g., accept and fix) or reject the suggested corrections to avoid decode errors based on the rules (e.g., per FIGS. 6A-6D).

At 716, the controller 110 (e.g., the decoders) applies intersections decoding if needed. If decoding does not succeed up to this point, additional decode methods can be implemented. Given that multi-dimensional codes are used, every input bit is encoded by multiple component codes. Therefore, using intersections decoding (e.g., complexity-limited intersections decoding) may be useful at this point. In an example, responsive to determining that there are still some unsolved decoder components, and there is no further progress of bounded distance iterative hard iterative decoding, intersections decoding can be implemented at 716.

Unsolved intersection bits are defined as information bits that belong to distinct component codes, all of which are unsolved (e.g., have missCorrection=1). The more component codes used, the smaller the bit-set of intersection between the component codes is. In HFPC codes disclosed herein, the intersections size is minimal on a regular code by construction, given that every component bit is cross-encoded by all other component codes. Such properties of the HFPC create smallest intersections sizes and enable low-complexity enumeration for intersections decoding. As described, the intersection bit-set length may change based on the payload size of component codes on a same dimension. In intersections decoding, bit-sets (obtained by intersections of component codes with non-zero (unsolved) syndromes) are mapped. If needed, the intersections bit-sets list size is limited. A number of bits for enumeration can be determined. The enumeration complexity is bounded by $$\binom{L_b}{N_b},$$

where $N_b$ is a number of bits that are simultaneously flipped every intersection's decoding, and $L_b$ is a number of bits in a single bit-set intersection. For every selected intersection-set enumerated over the intersection bits (every time another $N_b$ bits are flipped), decoding of the corresponding component codes is attempted on the selected dimensions. This enables correcting t+Nb errors of a single component code. Inversion of $N_b$ bits are accepted as valid solutions (of an intersection-set) if missCorrection=0 after decoding for a number of component codes exceeding some threshold (with respect to a single component, a zero threshold).

At 718, the controller 110 (e.g., the decoders) determines whether decode is successful or a maximum number of iterations has been reached. In response to determining that decode is not successful and the maximum number of iterations has not been reached (718:NO), the method 700 returns to 702 for a next iteration. On the other hand, in response to determining that decode is successful or the maximum number of iterations has been reached (718:YES), the controller 110 (e.g., the decoders) determines whether decode is successful or a maximum number of attempts has been reached, at 720. In response to determining that decode is not successful and a maximum number of attempts has not been reached (720:NO), the method 700 returns to 702 for a next attempt (and first iteration for the next attempt). On the other hand, in response to determining that decode is successful or a maximum number of attempts has been reached (720:YES), the hard decoding method 700 ends.

Figure 8:
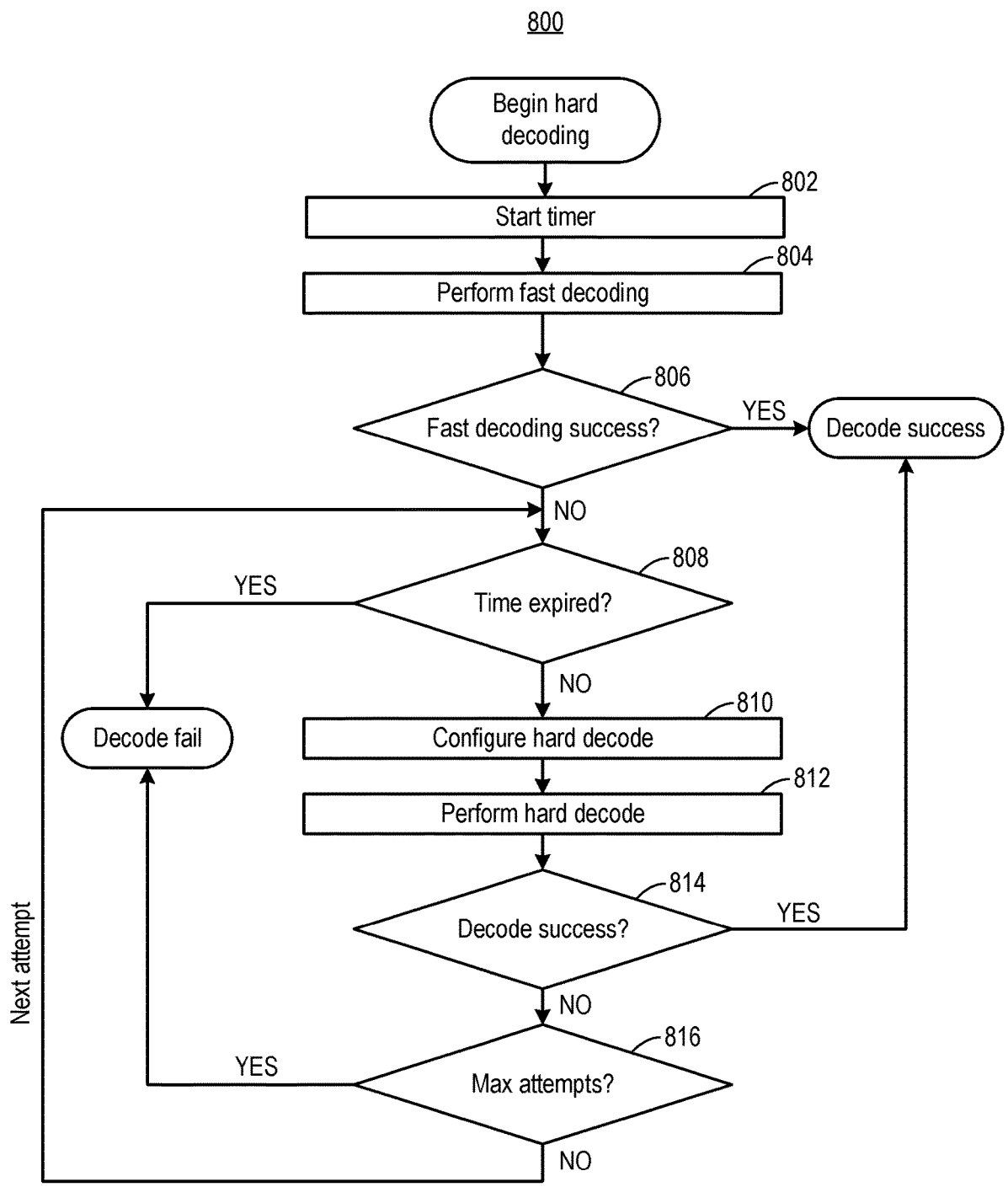
FIG. 8 is a process flow diagram illustrating an example hard decoding method, according to various implementations.

FIG. 8 is a process flow diagram illustrating an example hard decoding method 800, according to various implementations. Referring to FIGS. 1-8, the hard decoding method 800 can be performed by one or more decoders (e.g., one or more HFPC iterative hard decoders) implemented by the controller 110. The hard decoding method 800 is a multi-attempt HFPC iterative decoding method and includes the fast decoding and the safe decoding as described herein. The hard decoding method 800 operates on codewords, which may have errors (e.g., noise) added during read.

At 802, a timer is started by the controller 110 (e.g., the decoders). For implementation accuracy, the timer is configured to measure the time for each decoding configuration attempt. At the expiration of the timer, decoding can be terminated. In other words, the timer limits decoder complexity. The timer can be used in conjunction with other decoding parameters.

At 804, the controller 110 (e.g., the decoders) performs fast decoding. In some examples, in fast decoding, only inner component codes are used for decoding.

Sometimes the inner component codes decode only few errors (e.g. t<4 per BCH component code), thus decoding per component code can be efficient. In flash memory devices (e.g., the flash memory device 100), read performance depends on the decoder latency. Therefore, high-speed decoding is needed for high read performance. At low latency and when the number of errors is not too high, successful decoding using only iterative fast decoding is possible without the safe decoding and/or intersections decoding. On the other hand, in the cases in which inner decoding is not successful, other types of multi-dimensional decoding can be attempted.

At 806, the controller 110 (e.g., the decoders) determines whether fast decoding is successful. In response to determining that the fast decoding is successful (806:YES), the decode is successful. In response to determining that the fast decoding is not successful (806:NO), the controller 110 (e.g., the decoders) determines whether the timer has expired, at 808. In response to determining that the timer has expired (808:YES), the decode has failed.

On the other hand, in response to determining that the timer has not expired (808:NO), the controller 110 (e.g., the decoders) configures the hard decode at 810. In some examples, configuring the decode is performed once per iteration. In some examples, similar to described with respect to 702, configuring the decode includes one or more of setting safe decoding on or off, setting a number of errors correctable by each component code, forcing component-code state, setting a number of component codes to decode per dimension, and so on.

At 812, the controller 110 (e.g., the decoders) performs hard decode. Hard decode may include 702-718 of FIG. 7, performed iteratively as described. That is, responsive to determining that the fast decode attempt has failed, the decoders can be configured to apply the safe decoding (at 810) as described herein. 812 includes iteratively performing decoding in safe mode, using intersections decoding if needed as a complementary tool for resolving higher error rates or non-uniform error distributions.

At 814, the controller 110 (e.g., the decoders) determines whether hard decoding is successful. In response to determining that the hard decoding is successful (814:YES), the decode is successful. In response to determining that the hard decoding is not successful (814:NO), the controller 110 (e.g., the decoders) determines whether the maximum number of attempts has been reached at 816. In response to determining that the maximum number of attempts has been reached (816:YES), the decode has failed. On the other hand, in response to determining that the maximum number of attempts has not been reached (816:NO), the method 800 returns to 808 for a next attempt. For each decoding attempt, the decoding begins with the original input error distribution.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storages, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A method for error correction in a flash memory device, comprising:
    obtaining suggested corrections as a result of decoding a codeword comprising a plurality of component codes, wherein the decoding is performed in connection with a read operation of data from the flash memory device;
    determining whether a first set of the suggested corrections obtained based on a first component code of the plurality of component codes agree with a second set of the suggested corrections obtained based on a second component code of the plurality of component codes, wherein the determining includes identifying at least a first one of the first set of suggested corrections and at least a second one of the second set of suggested corrections that both suggest corrections for a same two or more bits from the data read from the flash memory device that are encoded by both the first and second component codes; and
    applying a set of ordered rules for selecting one of accepting the first set of the suggested corrections or rejecting the first set of the suggested corrections based on whether the first set of the suggested corrections and the second set of the suggested corrections agree, wherein the set of ordered rules includes at least one rule that forces acceptance of one or more additional suggested corrections in the first set of suggested corrections in addition to the first one of the first set of suggested corrections and one or more additional suggested corrections in the second set of suggested corrections in addition to the second one of the second set of suggested corrections.

2. The method of claim 1, wherein
    the codeword corresponds to an input payload having input bits;
    the input bits are organized into a pseudo triangular matrix;
    each row or column of the pseudo triangular matrix differs from an adjacent row or column by two or more bits; and
    the input bits are encoded using the plurality of component codes based on mapping each of the input bits to two or more of the plurality of component codes based on the pseudo triangular matrix.

3. The method of claim 2, wherein
    the pseudo triangular matrix comprises a plurality of blocks;
    each of the plurality of blocks comprises two or more of the input bits;
    the first component code and the second component code encode a same block of the plurality of blocks.

4. The method of claim 1, wherein determining whether the first set of the suggested corrections agree with the second set of the suggested corrections comprises determining that the first set of the suggested corrections agrees with the second set of the suggested corrections in response to:
    determining that the first set of the suggested corrections and the second set of the suggested corrections comprise a same number of suggested corrections;
    determining that the first set of the suggested corrections comprises a suggested correction; and
    determining that the second set of the suggest corrections comprises the same suggested correction.

5. The method of claim 4, further comprising selecting to accept the first set of the suggested corrections and the second set of the suggested corrections in response to determining that the first set of the suggested corrections agrees with the second set of the suggested corrections, by at least one bit.

6. The method of claim 4, wherein a same two or more bits are mapped to both the first component code and the second component code.

7. The method of claim 4, wherein the same number of suggested corrections is the error correction capability of the first component code and the second component code.

8. The method of claim 1, wherein determining whether the first set of the suggested corrections agree with the second set of the suggested corrections comprises determining that the first set of the suggested corrections does not agree with the second set of the suggested corrections in response to:
  determining that the first set of the suggested corrections comprises a suggested correction for two or more bits that are mapped to both the first component code and the second component code; and
  determining that the second set of the suggested corrections are for bits other than the two or more bits that are mapped to both the first component code and the second component code.

9. The method of claim 8, the first set of the suggested corrections comprises a number of suggested corrections equal to an error correction capability of the first component code.

10. The method of claim 8, further comprising rejecting the first set of the suggested corrections in response to determining that the first set of the suggested corrections does not agree with the second set of the suggested corrections.

11. The method of claim 1, wherein determining whether the first set of the suggested corrections agree with the second set of the suggested corrections comprises determining that the first set of the suggested corrections does not agree with the second set of the suggested corrections in response to:
  determining that the second set of the suggested corrections comprises a suggested correction for two or more bits that are mapped to both the first component code and the second component code; and
  determining that the first set of the suggested corrections are for bits other than the two or more bits that are mapped to both the first component code and the second component code.

12. The method of claim 11, wherein the first set of the suggested corrections comprises a number of suggested corrections equal to an error correction capability of the first component code.

13. The method of claim 11, further comprising rejecting the first set of the suggested corrections in response to determining that the first set of the suggested corrections does not agree with the second set of the suggested corrections.

14. The method of claim 1, wherein determining whether the first set of the suggested corrections agree with the second set of the suggested corrections comprises determining that the first set of the suggested corrections does not agree with the second set of the suggested corrections in response to determining that the first set of the suggested corrections and the second set of the suggested corrections do not have any suggested correction in common.

15. The method of claim 14, further comprising rejecting the second set of the suggested corrections in response to determining that the first set of the suggested corrections does not agree with the second set of the suggested corrections.

16. The method of claim 14, wherein
  the first set of the suggested corrections comprises a number of suggested corrections less than an error correction capability of the first component code; and
  the second set of the suggested corrections comprises a number of suggested corrections equal to an error correction capability of the second component code.

17. The method of claim 1, wherein the plurality of component codes are Bose-Chaudhuri-Hocquenghem (BCH) components.

18. A flash memory device, comprising:
a non-volatile memory; and
a controller configured to perform error correction for the non-volatile memory by:
  obtaining suggested corrections as a result of decoding a codeword comprising a plurality of component codes, wherein the decoding is performed in connection with a read operation of data from the flash memory device;
  determining whether a first set of the suggested corrections obtained based on a first component code of the plurality of component codes agree with a second set of the suggested corrections obtained based on a second component code of the plurality of component codes, wherein the determining includes identifying at least a first one of the first set of suggested corrections and at least a second one of the second set of suggested corrections that both suggest corrections for a same two or more bits from the data read from the flash memory device that are encoded by both the first and second component codes; and
  applying a set of ordered rules for selecting one of accepting the first set of the suggested corrections or rejecting the first set of the suggested corrections based on whether the first set of the suggested corrections and the second set of the suggested corrections agree, wherein the set of ordered rules includes at least one rule that forces acceptance of one or more additional suggested corrections in the first set of suggested corrections in addition to the first one of the first set of suggested corrections and one or more additional suggested corrections in the second set of suggested corrections in addition to the second one of the second set of suggested corrections.

19. The flash memory device of claim 18, wherein
the codeword corresponds to an input payload having input bits;
the input bits are organized into a pseudo triangular matrix;
each row or column of the pseudo triangular matrix differs from an adjacent row or column by two or more bits; and
the input bits are encoded using the plurality of component codes based on mapping each of the input bits to two or more of the plurality of component codes based on the pseudo triangular matrix.

20. A non-transitory computer-readable medium storing computer-readable instructions, such that when executed, causes a controller of a flash memory device to perform error correction by:
  obtaining suggested corrections as a result of decoding a codeword comprising a plurality of component codes, wherein the decoding is performed in connection with a read operation of data from the flash memory device;
  determining whether a first set of the suggested corrections obtained based on a first component code of the plurality of component codes agree with a second set of the suggested corrections obtained based on a second component code of the plurality of component codes, wherein the determining includes identifying at least a first one of the first set of suggested corrections and at least a second one of the second set of suggested corrections that both suggest corrections for a same two or more bits from the data read from the flash memory device that are encoded by both the first and second component codes; and applying a set of ordered rules for selecting one of accepting the first set of the suggested corrections or rejecting the first set of the suggested corrections based on whether the first set of the suggested corrections and the second set of the suggested corrections agree, wherein the set of ordered rules includes at least one rule that forces acceptance of one or more additional suggested corrections in the first set of suggested corrections in addition to the first one of the first set of suggested corrections and one or more additional suggested corrections in the second set of suggested corrections in addition to the second one of the second set of suggested corrections.

* * * * *